US007920011B1

(12) United States Patent
Tseng

(10) Patent No.: US 7,920,011 B1
(45) Date of Patent: Apr. 5, 2011

(54) VOLTAGE TRIMMING CIRCUIT

(75) Inventor: Kuan-Jen Tseng, Sinshih Township, Tainan County (TW)

(73) Assignee: Himax Analogic, Inc., Sinshih Township, Tainan County (TW)

( * ) Notice: Subject to any disclaimer, the term of this patent is extended or adjusted under 35 U.S.C. 154(b) by 0 days.

(21) Appl. No.: 12/560,616

(22) Filed: Sep. 16, 2009

(51) Int. Cl.
*H03L 5/00* (2006.01)
*H03K 5/08* (2006.01)

(52) U.S. Cl. .......................... 327/309; 327/306; 327/308

(58) Field of Classification Search .................. 327/306, 327/309, 308
See application file for complete search history.

(56) References Cited

U.S. PATENT DOCUMENTS 4,072,906 A * 2/1978 Schroder ......................... 330/86
4,978,904 A * 12/1990 Fitzpatrick et al. ........... 323/313
5,923,164 A * 7/1999 Ehling et al. ............. 324/207.13
6,650,173 B1 * 11/2003 Khouri et al. ................. 327/538
6,949,971 B2 * 9/2005 Jang .............................. 327/541
7,615,980 B2 * 11/2009 Sase et al. ..................... 323/284
2001/0033195 A1 * 10/2001 Kanda et al. .................. 327/541
2005/0024129 A1 * 2/2005 Jang .............................. 327/541

* cited by examiner

*Primary Examiner* — Lincoln Donovan
*Assistant Examiner* — Ryan C Jager
(74) *Attorney, Agent, or Firm* — Thomas, Kayden, Horstemeyer & Risley, LLP

(57) ABSTRACT

A voltage trimming circuit is provided. The voltage trimming circuit has an input stage, an up-trimming resistor ladder, a down-trimming resistor ladder and a control means. The input stage has a first input, a second input and an output, wherein the first output is to receive an input voltage, the second input is connected to a connection point and the output is to provide an output voltage based on a difference between the voltage of the first and the second input. The up-trimming resistor ladder is connected between the output of the input stage and the connection point and the down-trimming resistor ladder connected between a ground potential and the connection point. The control means controls the resistance of the up-trimming and the down-trimming resistor ladder to up-trim or down-trim the output voltage.

9 Claims, 3 Drawing Sheets

VOLTAGE TRIMMING CIRCUIT

BACKGROUND

1. Field of Disclosure

The present disclosure relates to a circuit. More particularly, the present disclosure relates to a voltage trimming circuit.

2. Description of Related Art

The reference voltage in a circuit, such as a low drop out linear regulator, has to be very precise. However, the reference voltage generating circuit may suffer from many undesirable effects resulting in an inaccurate output voltage. Thus, a trimming mechanism is needed to tune the inaccurate output voltage back to the desired value of the output voltage to provide the accurate reference voltage.

Nevertheless, the conventional design of the voltage trimming circuit provides only up-trimming mechanism to up-trim an initial output voltage from a value lower than the target output voltage. Once the initial output voltage is higher than the target output voltage, the up-trimming mechanism fails to reach the target output voltage. In addition, if the initial voltage with lower value is generated first, it may have to take more bits of trimming voltage steps to reach the target output voltage. Thus, the more bits of trimming voltage steps it takes to trim the output voltage, the more the LSB error will be generated.

Thus, what is needed is a voltage trimming circuit provides both up-trimming and down-trimming mechanism. The present disclosure addresses such a need.

SUMMARY

A voltage trimming circuit has an input stage, an up-trimming resistor ladder, a down-trimming resistor ladder and a control means. The input stage has a first input, a second input and an output, wherein the first output is to receive an input voltage, the second input is connected to a connection point and the output is to provide an output voltage based on a difference between the voltage of the first input and the second input. The up-trimming resistor ladder is connected between the output of the input stage and the connection point and the down-trimming resistor ladder connected between a ground potential and the connection point. The control means is to control the resistance of the up-trimming resistor ladder and the down-trimming resistor ladder. Wherein the output voltage is not trimmed when the resistance of the up-trimming resistor ladder and the down-trimming resistor ladder are equal, the output voltage is up-trimmed when the control means makes the resistance of the up-trimming resistor ladder larger than resistance of the down-trimming resistor ladder and the output voltage is down-trimmed when the control means makes the resistance of the down-trimming resistor ladder larger than the resistance of the up-trimming resistor ladder.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
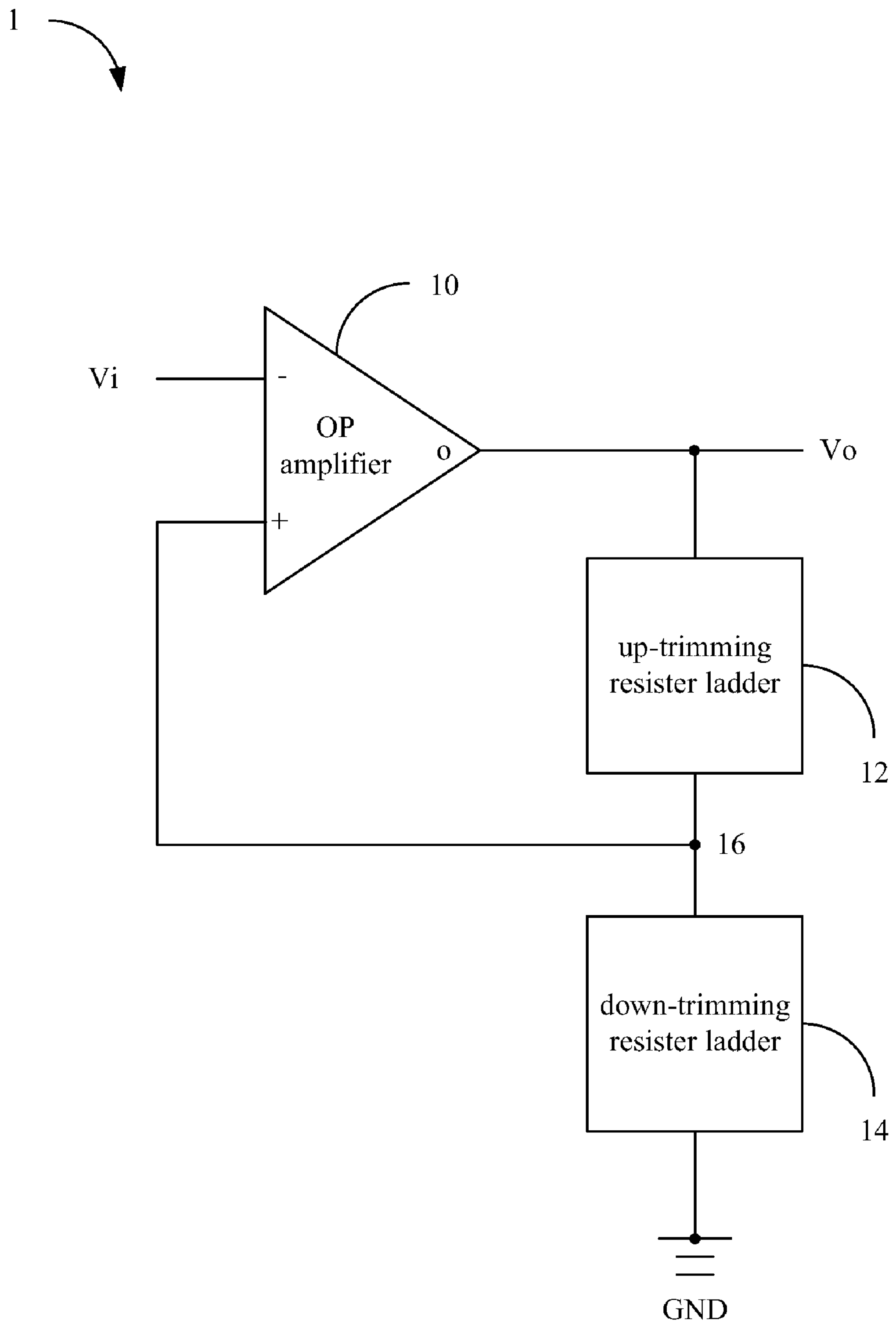
FIG. 1 is a diagram of a voltage trimming circuit of an embodiment the present disclosure.

Reference will now be made in detail to the present embodiments of the disclosure, examples of which are illustrated in the accompanying drawings. Wherever possible, the same reference numbers are used in the drawings and the description to refer to the same or like parts.

Please refer to FIG. 1. FIG. 1 is a diagram of a voltage trimming circuit 1 of an embodiment the present disclosure. The voltage trimming circuit 1 has an input stage 10, an up-trimming resistor ladder 12, a down-trimming resistor ladder 14 and a control means (depicted in FIG. 2).

The input stage 10 has a first input, a second input and an output. The input stage 10 in the present disclosure is an operational amplifier 10. Therefore, the first input of the input stage 10 is the inverting input (depicted in FIG. 1 as the symbol '−') of the operational amplifier 10, the second input is the non-inverting input (depicted in FIG. 1 as the symbol '+') of the operational amplifier 10, and the output is the output (depicted in FIG. 1 as the symbol 'o') of the operational amplifier 10. The inverting input is to receive an input voltage Vi. The non-inverting input is connected to a connection point 16 and the output is to generate an output voltage Vo based on a difference between the voltage of the first input and the second input, i.e. the inverting and the non-inverting inputs. The up-trimming resistor ladder 12 is connected between the output of the operational amplifier 10 and the connection point 16. The down-trimming resistor ladder 14 is connected between a ground potential GND and the connection point 16.

Figure 2:
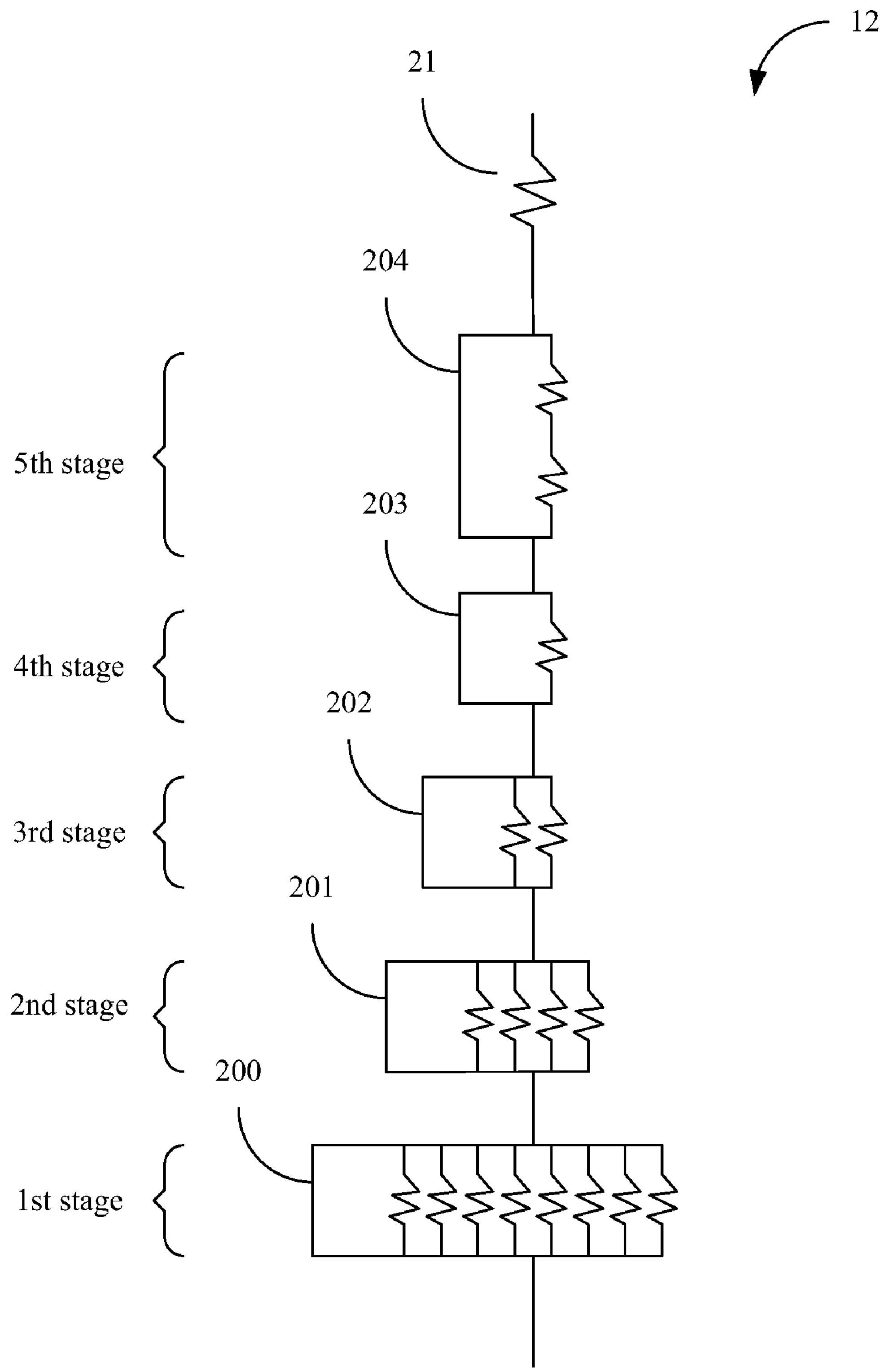
FIG. 2 is a diagram of the up-trimming resistor stages and the control means in an embodiment of the present disclosure.

Please refer to FIG. 2 at the same time. FIG. 2 shows the up-trimming resistor ladder 12 and the control means in an embodiment of the present disclosure. In the present embodiment, each up-trimming resistor ladder 12 and down-trimming resistor ladder 14 has five trimming resistor stages and a reference resistor 21. The resistance of the N-th trimming resistor stage is $2^{N-1}$ times of the resistance of the first trimming resistor stage. The control means has five switches (200-204) each connected in parallel to a trimming resistor stage.

In the present embodiment, the first stage comprises eight resistors connected in parallel, the second stage comprises four resistors connected in parallel, the third stage comprises two resistors connected in parallel, the fourth stage comprises one resistor and the fifth stage comprises two resistors connected in serial. All the resistors in each stage are the same. Thus, the resistance of the second stage is double the resistance of the first stage, the resistance of the third stage is four times larger than the resistance of the first stage, the resistance of the fourth stage is eight times larger than the resistance of the first stage and the resistance of the fifth stage is sixteen times larger than the resistance of the first stage.

Each of the five switches 200-204 of the control means is connected in parallel with a trimming resistor stage, as depicted in FIG. 2. The reference resistor 21 is connected to the trimming resistor stages and the switches 200-204 in serial. In the present embodiment, the up-trimming resistor ladder 12 and the down-trimming resistor ladder 14 has symmetrical structure. Therefore, the description of the down-trimming resistor ladder 14 is omitted here.

The output voltage Vo can be represented as the following equation:

$$Vo=Vi*(1+Ru/Rd)$$

wherein the Ru is the resistance of the up-trimming resister ladder 12 and the Rd is the resistance of the down-trimming resister ladder 14. When the switches 200-204 are closed, the input voltage Vi is tuned to the half of a target output voltage. Due to the symmetrical structure of the up-trimming resistor ladder 12 and the down-trimming resistor ladder 14, the resistance of the up-trimming resistor ladder 12 and the down-trimming resistor ladder 14 are the same. Therefore, according to the above equation, the output voltage Vo is about twice that of the input voltage Vi. However, the output voltage Vo may not be exactly twice of the input voltage Vi because the circuit is imperfect. Therefore, a trimming mechanism is needed.

Because there are five switches 200-204, the switches 200-204 are able to perform thirty-two connecting modes. When the switch 200 corresponding to the first stage is open, the total resistance of the up-trimming resistor ladder 12 becomes higher. The total resistances of the up-trimming resistor ladder 12 and the down-trimming resistor ladder 14 becomes asymmetrical. Thus, the output voltage Vo becomes higher due to the up-trimming mechanism provided by the up-trimming resistor ladder 12. If the output voltage Vo is still lower than the target output voltage, an appropriate connecting mode of the switches 200-204 can be chosen to further pull up the output voltage Vo and tune the output voltage Vo to the target output voltage. The switches 200-204 are able to perform thirty-two connecting modes, therefore thirty-two up-trimming steps of voltage are provided to up-trim the output voltage Vo.

It's noticed that in the present embodiment, the resistance of the N-th trimming resistor stage of the up-trimming resistor ladder 12 is $2^{N-1}$ times of the resistance of the first trimming resistor stage of the up-trimming resistor ladder 12, as described above. According to the above characteristic, the voltage increment of the N-th trimming step becomes $2^{N-1}$ times of voltage increment of the first trimming step. Therefore, the voltage trimming circuit 1 provides a bit-wise up-trimming mechanism. The connecting modes can be represented as a 5-bit binary number.

Figure 3:
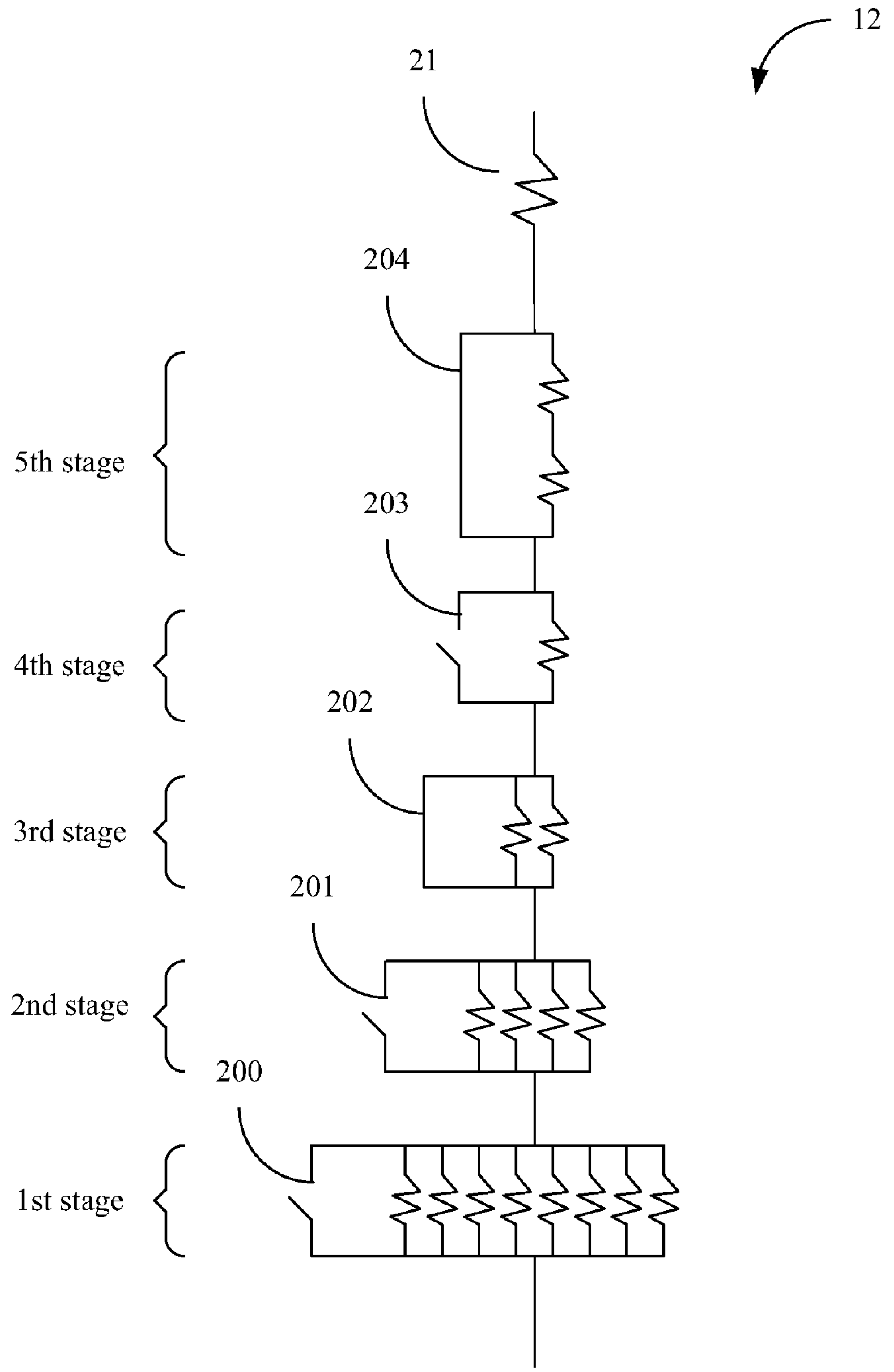
FIG. 3 is a diagram of the up-trimming resistor stages and the control means of FIG. 2 operated in one of the connecting modes.

Please refer to FIG. 3. FIG. 3 shows the up-trimming resistor ladder 12 and the control means of FIG. 2 operated in one of the connecting modes. The switches 200, 201 and 203 corresponding to the first, second and the fourth stages turn open. Thus, the connecting mode can be represented as 01011. If the resistance of reference resistor 21 of the up-trimming resistor ladder 12 is R1 and the resistance of each of the resistor of the trimming resistor stages is R2, then the total resistance of the up-trimming resistor ladder 12 of the connecting mode 01011 can be represented as:

$$Ru(01011)=R1+R2+R2/4+R2/8$$

The total resistance of the up-trimming resistor ladder 12 increases. If all the switches of the down-trimming resistor ladder 14 are still closed, the resistance of the down-trimming resistor ladder 14 is unchanged and is still R1. Therefore, the resistance of the up-trimming resistor ladder 12 becomes larger than the resistance of the down-trimming resistor ladder 14. The output voltage is up-trimmed due to the asymmetric resistance of the current connecting mode.

Likewise, when the switch corresponding to the first stage in the down-trimming resistor ladder turns open, the total resistance of the down-trimming resistor ladder 14 becomes higher. The total resistances of the up-trimming resistor ladder 12 and a down-trimming resistor ladder 14 becomes asymmetrical. Thus, the output voltage Vo becomes lower due to the down-trimming mechanism provided by the down-trimming resistor ladder 14. If the output voltage Vo is still higher than the target output voltage, an appropriate connecting mode of the switches in the down-trimming resistor ladder 14 can be chosen to further pull down the output voltage Vo and tune the output voltage Vo to the target output voltage. The switches are able to perform 32 connecting modes, therefore 32 down-trimming steps of voltage is provided to down-trim the output voltage Vo.

It's noticed that in the present embodiment, the resistance of the N-th trimming resistor stage of the down-trimming resistor ladder 14 is $2^{N-1}$ times the resistance of the first trimming resistor stage of the down-trimming resistor ladder 14, as described above. According to the above characteristic, the voltage drop of the N-th trimming step becomes $2^{N-1}$ times the voltage drop of the first trimming step. Therefore, the voltage trimming circuit 1 provides a bit-wise down-trimming mechanism. The connecting modes can be represented as a 5-bit binary number.

The number of the trimming resistor stages in the up-trimming resistor ladder 12 and a down-trimming resistor ladder 14 can be different in other embodiments. When the number of the trimming resistor stages of each of the up-trimming and the down-trimming resistor ladder is M, the switches of each of the up-trimming and the down-trimming resistor ladder have $2^M$ connecting modes to perform $2^M$ up-trimming steps and $2^M$ down-trimming steps. Also, the structure of each stage in the up-trimming resistor ladder and the down-trimming resistor ladder can be different in other embodiment.

In another embodiment, the up-trimming resistor ladder and the down-trimming resistor ladder is not necessarily symmetrical, and the input voltage is not necessarily the half of the target output voltage. However, the asymmetrical structure is not easy to design and may have to spend more time to adjust the structure of the resistance in each stage. Thus, the symmetrical structure of the above embodiment is much more desirable.

In the conventional design, the voltage trimming circuit provides only up-trimming mechanism to up-trim an initial output voltage from a value lower than the target output voltage. Once the initial output voltage is higher than the target output voltage, the up-trimming mechanism fails to reach the target output voltage. In addition, if the initial voltage with lower value is generated first, it may have to take more bits of trimming voltage steps to reach the target output voltage. Thus, the more bits of trimming voltage steps it takes to trim the output voltage, the more the LSB error will be generated, which is an undesirable result.

Thus, the voltage trimming circuit of the present disclosure provides both an up-trimming and a down-trimming mechanism. Fewer bits are required to tune the output voltage to the target output voltage. If the same range of the voltage trimming steps is provided in the conventional design and the present disclosure, the LSB error in the conventional design is greater. Take ten voltage trimming steps for example, the voltage trimming circuit of the present disclosure takes $2^5$ which is 32 bits for up-trimming steps, and takes $2^5$ which is 32 bits for down-trimming steps as well. However, the voltage trimming circuit of the conventional design takes $2^{10}$, which is 1024 bits for up-trimming steps. If each of the resistors of the trimming stages has a deviation from the correct value of the resistance, the stage with higher resistance will have larger scale of error. This is the so-called LSB error. Thus, the voltage trimming circuit of the present disclosure further provides a trimming mechanism with lesser LSB error. Therefore, the accurate output voltage generated by the voltage trimming circuit in the present disclosure can be further used as the reference voltage of other circuit.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A voltage trimming circuit comprising:

an input stage having a first input, a second input and an output, wherein the first input is to receive an input voltage, the second input is connected to a connection point and the output is to provide an output voltage based on a difference between voltages of the first input and the second input;

an up-trimming resistor ladder connected between the output of the input stage and the connection point;

a down-trimming resistor ladder connected between a ground potential and the connection point, wherein each of the up-trimming and the down-trimming resistor ladder comprises:

a plurality of trimming resistor stages, wherein the resistance of the N-th trimming resistor stage is substantially $2^{N-1}$ times of the resistance of the first trimming resistor stage; and a reference resistor connected serially to the plurality of trimming resistor stages; and a control means to control the resistance of the up-trimming resistor ladder and the down-trimming resistor ladder;

wherein the output voltage is not trimmed when the resistance of the up-trimming resistor ladder and the down-trimming resistor ladder are equal, the output voltage is up-trimmed when the control means makes the resistance of the up-trimming resistor ladder larger than the resistance of the down-trimming resistor ladder and the output voltage is down-trimmed when the control means makes the resistance of the down-trimming resistor ladder larger than the resistance of the up-trimming resistor ladder.

2. The voltage trimming circuit of claim 1, wherein the input stage is an operational amplifier, the first input is the inverting input of the operational amplifier and the second input is the non-inverting input of the operational amplifier.

3. The voltage trimming circuit of claim 1, wherein the control means comprises a plurality of switches each connected in parallel with a trimming resistor stage of the up-trimming and the down-trimming resistor ladder.

4. The voltage trimming circuit of claim 3, wherein the output voltage is not trimmed when all the switches are closed, the output voltage is up-trimmed when at least one of the switches of the up-trimming resistor ladder is open and the output voltage is down-trimmed when at least one of the switches of the down-trimming resistor ladder is open.

5. The voltage trimming circuit of claim 3, when the number of the trimming resistor stages of the up-trimming resistor ladder is M, the switches of the up-trimming resistor ladder have connecting modes to perform up-trimming steps.

6. The voltage trimming circuit of claim 3, when the number of the trimming resistor stages of the down-trimming resistor ladder is M, the switches of the down-trimming resistor ladder have $2^M$ connecting modes to perform $2^M$ down-trimming steps.

7. The voltage trimming circuit of claim 3, wherein the up-trimming and the down-trimming resistor ladders are symmetrical.

8. The voltage trimming circuit of claim 7, when the number of the trimming resistor stages of each of the up-trimming and the down-trimming resistor ladder is M, the switches of each of the up-trimming and the down-trimming resistor ladder have $2^M$ connecting modes to perform $2^M$ up-trimming steps and $2^M$ down-trimming steps.

9. The voltage trimming circuit of claim 3, wherein the input voltage is tuned to the half of a target output voltage when all the switches are closed.

* * * * *